United States Patent
Yin et al.

(10) Patent No.: US 9,257,212 B2
(45) Date of Patent: Feb. 9, 2016

(54) DIELECTRIC MATERIAL WITH LOW DIELECTRIC LOSS

(71) Applicant: ITEQ CORPORATION, Taoyuan County (TW)

(72) Inventors: Meng-Song Yin, Taoyuan County (TW); Li-Chun Chen, Taoyuan County (TW)

(73) Assignee: ITEQ CORPORATION, Taoyuan (TW)

( * ) Notice: Subject to any disclaimer, the term of this patent is extended or adjusted under 35 U.S.C. 154(b) by 373 days.

(21) Appl. No.: 13/845,908

(22) Filed: Mar. 18, 2013

(65) Prior Publication Data

US 2014/0275377 A1  Sep. 18, 2014

(51) Int. Cl.
| | |
|---|---|
| *H01B 3/30* | (2006.01) |
| *C08L 71/12* | (2006.01) |
| *C08L 79/08* | (2006.01) |
| *H05K 1/03* | (2006.01) |
| *H01B 3/42* | (2006.01) |
| *H01B 3/44* | (2006.01) |
| *H05K 3/02* | (2006.01) |

(52) U.S. Cl.
CPC ............... *H01B 3/306* (2013.01); *C08L 71/12* (2013.01); *C08L 79/085* (2013.01); *H01B 3/307* (2013.01); *H01B 3/427* (2013.01); *H01B 3/442* (2013.01); *H01B 3/448* (2013.01); *H05K 1/0353* (2013.01); *H05K 1/0373* (2013.01); *H05K 1/0366* (2013.01); *H05K 3/022* (2013.01)

(58) Field of Classification Search
CPC ...... H01B 3/306; H01B 3/427; H05K 1/0353; C08L 79/085; C08L 71/12
See application file for complete search history.

(56) References Cited

U.S. PATENT DOCUMENTS

| 7,282,554 B2 * | 10/2007 | Mitsui et al. ................... 528/217 |
| 2009/0203279 A1 * | 8/2009 | Mori et al. ..................... 442/233 |
| 2013/0252003 A1 * | 9/2013 | Liu ................................ 428/457 |
| 2014/0275335 A1 * | 9/2014 | Yin et al. ....................... 523/223 |

FOREIGN PATENT DOCUMENTS

| CN | 101289545 A | 10/2008 |
| CN | 101314630 A | 12/2008 |
| CN | 101570640 A | 11/2009 |
| CN | 101692756 A | 4/2010 |
| CN | 102336935 A | 2/2012 |
| JP | 2010111758 A | 5/2010 |
| JP | 20111473 A | 1/2011 |
| TW | 200740309 | 10/2007 |
| TW | 200813124 A | 3/2008 |
| TW | 200823246 A | 6/2008 |
| TW | 201124478 A * | 7/2011 |

OTHER PUBLICATIONS

Wang Yongqiang, et al., "Fire-retardant Materials and Its Application", Chemical Industry Press, Materials Science and Engineering Publishing Center, 2003 pp. 1-7.

* cited by examiner

*Primary Examiner* — Vickey Nerangis
(74) *Attorney, Agent, or Firm* — Muncy, Geissler, Olds & Lowe, P.C.

(57) ABSTRACT

The invention provides a dielectric material with low dielectric loss. The dielectric material comprises (i) 40~80 parts by weight of polyphenylene ether resin having a Mw of 1000~7000, a Mn of 1000~4000 and Mw/Mn=1.0~1.8; (ii) 5~30 parts by weight of bismaleimide resins; and (iii) 5~30 parts by weight of polymer additives, wherein the dielectric material has Dk of 3.75~4.0 and Df of 0.0025~0.0045. The dielectric material is suitably used in prepregs and insulation layers of a circuit board, because it has high Tg, low thermal expansion coefficient, low moisture absorption and excellent dielectric properties such as Dk and Df.

3 Claims, No Drawings

DIELECTRIC MATERIAL WITH LOW DIELECTRIC LOSS

BACKGROUND OF THE INVENTION

1. Technical Field

The invention relates to a dielectric material with low dielectric loss, particularly to a resin composition.

2. Related Art

As developed with wireless transmission products and technologies of transmitting high frequency, epoxy resin and novolak resin cannot satisfied for the advance application, especially high frequency printed circuit board (PCB). Fluorine-containing resin can be used as PCB with low dielectric loss. However, fluorine-containing resin is expensive and not easy to work, and thus limited to the use of military and astrodynamics. In addition, polyphenylene ether (PPE) resin has excellent mechanical property and dielectric property such as Dk and Df Therefore, the PPE resin is preferable to be used a material for high frequency PCB.

However, because the PPE resin is a thermal plastic resin, as applied in a copper-clad laminate, it may has disadvantages as follows: it is not easy to work due to a high melting viscosity of PPE resin, interlayer film is easy released in a solvent clean step during a process for manufacturing PCB due to a poor solvent resistance of PPE resin, and it is not easy to operate above a temperature of 250° C. in soldering process due to melting point close to Tg. Therefore, PPE resin has to be modified by curing so as to meet the requirement of using in PCB.

Curing modification of PPE resin generally has two manners: PPE resin may become curable resin by introducing crosslinking active functional groups to molecular structure of PPE resin. Alternatively, PPE resin may become co-mixing curable composite material by introducing other curable resins to molecular structure of PPE resin with co-mixing modification or interpenetrating network technology. However, PPE resin is likely incompatible with the active functional groups or curable resins, because the polar difference exists in their chemical structures. Alternatively, PPE resin may lose the excellent properties, after it conducts curing modification with the active functional groups or curable resins.

Therefore, there is a need to develop a material has excellent dielectric properties and other properties such as high Tg, low coefficient of thermal expansion and low water absorption of PCB requirement. Also, the material can be applied in the manufacture of high frequency PCB.

SUMMARY OF THE INVENTION

An object of the invention is to provide a dielectric material with low dielectric loss, which has excellent dielectric properties, low coefficient of thermal expansion and low water absorption.

To accomplish the above object, there is provided a dielectric material with low dielectric loss, which comprises (i) 40~80 parts by weight of polyphenylene ether resin having a Mw of 1000~7000, a Mn of 1000~4000 and Mw/Mn=1.0~1.8; (ii) 5~30 parts by weight of bismaleimide; and (iii) 5~30 parts by weight of polymer additives, wherein the dielectric material has Dk of 3.75~4.0 and Df of 0.0025~0.0045.

In the dielectric material with low dielectric loss of the invention, the polyphenylene ether resin is represented by the formula

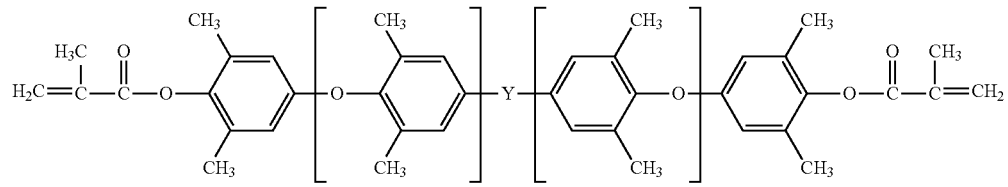

wherein Y represents at least one C, O and benzene ring or the combination.

In the dielectric material with low dielectric loss of the invention, bismaleimide resins are selected from groups consisting of Phenylmethane maleimide

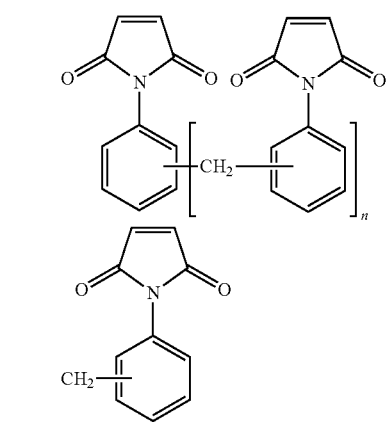

wherein $n \geq 1$;

Bisphenol A diphenyl ether bismaleimide

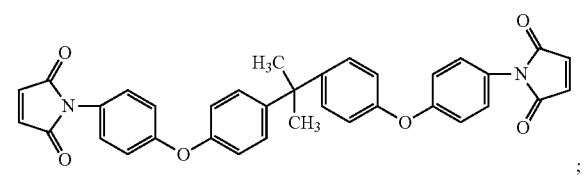 [SMILES: CC(C)(c1ccc(Oc2ccc(N3C(=O)C=CC3=O)cc2)cc1)c1ccc(Oc2ccc(N3C(=O)C=CC3=O)cc2)cc1]

3,3'-dimethyl-5,5'-diethyl-4,4'-diphenylethane bismaleimide

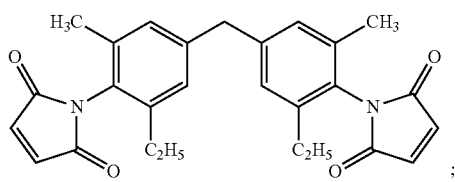 [SMILES: CCc1cc(Cc2cc(C)c(N3C(=O)C=CC3=O)c(CC)c2)cc(C)c1N1C(=O)C=CC1=O]

and
1,6-bismaleimide-(2,2,4-trimethyl)hexane.

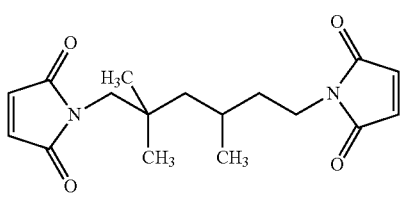 [SMILES: CC(CCN1C(=O)C=CC1=O)CC(C)(C)CN1C(=O)C=CC1=O]

In the dielectric material with low dielectric loss of the invention, the polymer additives are selected from groups consisting of Homopolymers of Butadiene

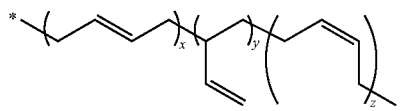

wherein y=70% and x+z=30%;
Random copolymers of butadiene and styrene

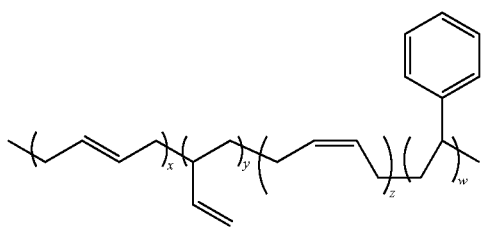

wherein y=30%, x+z=70% and w=≥1, and the amount of styrene=25 wt %;
Maleinized Polybutadiene

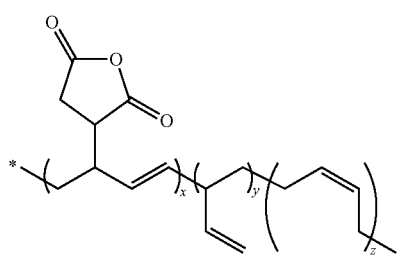

wherein y=28% and x+z=72%, the amount of maleic anhydride=8 wt %;
Butadiene-styrene-divinylbenzene copolymer; and
Styrene Maleic Anhydride copolymer

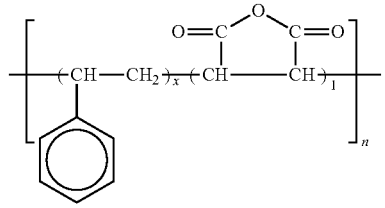

wherein X=1~8 and n≥1.

In the dielectric material with low dielectric loss of the invention, it is preferable that crosslinking agent is added to increase crosslinking density of resins. The crosslinking agents with 40-80 parts by weight may be selected from the following groups consisting of

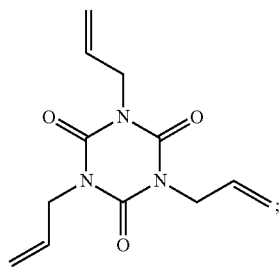

Triallyl isocyanurate (TAIC)

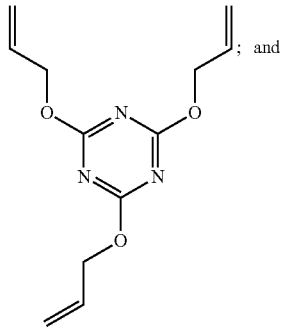

Triallyl cyanurate (TAC)

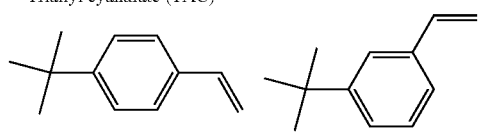

4-tert-butylstyrene (TBS)

In the dielectric material with low dielectric loss of the invention, it is preferable that catalyst is added to increase reaction of crosslinking agents and other resins. The catalysts includes at least one peroxide having 116° C.-128° C. for a half life of 10 hours with 2-8 phr based on the total weight of PPE, BMI, polymer additives and crosslinking agents. The suitable peroxides comprise dicumyl peroxide, α,α'-bis(tert-butylperoxy)diisopropyl benzene and 2,5-di(tert-butylperoxy)-2,5-dimethyl-3-hexyne.

In the dielectric material with low dielectric loss, it is preferable that filler is added to increase thermal conductivity and mechanical strength, and reduce thermal expansion. The suitable fillers may be fused silica, sphere-shaped silica, talc and aluminum silicate.

In order to increase flame retardation of the dielectric material of the invention, halogen-containing flame retardants and flame retardants without halogen may be used. The halogen-containing flame retardants may comprise decabromodiphenyl ethane. The flame retardants without halogen may comprise phosphor-containing flame retardants and phosphates. The phosphor-containing flame retardants and phosphates are produced by ALBEMARLE CO., LTD. The phosphates are like tetrakis(2,6-dimethylphenyl) 1,3-phenytene bisphosphate. tetrakis(2,6-dimethylphenyl) 1,3-phenylene bisphosphate can be represented by the formula,

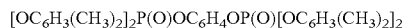

$[OC_6H_3(CH_3)_2]_2P(O)OC_6H_4OP(O)[OC_6H_3(CH_3)_2]_2$

The foregoing and other objects, features and advantages of the present invention will be apparent to those skilled in the art from the following detailed description.

BRIEF DESCRIPTION OF THE DRAWINGS

No Drawings

DETAILED DESCRIPTION OF THE INVENTION

In one aspect of the present invention, there is provided a thermal curable dielectric material to produce a prepreg in a successive process in the following examples 4-1 to 4-7. The process uses the dielectric material as a coating on a substrate which may be a fiberglass cloth. The apparatus for producing the prepreg includes a pasting tank wherein there are provided a plurality of rolls. The pasting tank is filled with the dielectric material. A roll of fiberglass cloth may enter the pasting tank and pass the plurality of rolls. The fiberglass cloth is sufficiently impregnated with the dielectric material, and then surplus dielectric material is removed by a metering roller. A heat treatment for curing the dielectric material and removing the solvent is required at 100° C. to 350° C. for 1 minute to 5 hours, preferably at 150° C. to 300° C. for 1 minute to 3 hours. The prepreg is Obtained after the cured dielectric material is cooled down and the fiberglass cloth is wrapped.

A double-sided copper-clad laminate is produced by providing several prepregs in a neat stack between two electrodeposited copper foils, conducting a hot pressing process under 40 to 900 psi, raising temperature from 80° C. to 200° C. in 30 minutes, and then hot pressing at 200° C. for 120 minutes, and then cooling down to room temperature in 30 minutes in a vacuum pressing machine. The prepreg includes a fiberglass cloth of electrical grade 2116 and the dielectric material. Generally, a double-sided copper-clad laminate with a thickness of 1.0 mm is produced by providing 4 sheets of prepregs in a neat stack between two electrodeposited copper foils, with a thickness of 1.5 mm is produced by providing 7 sheets of prepregs, and with a thickness of 2.0 mm is produced by providing 10 sheets of prepregs.

The dielectric material of the present invention may form a stable homogeneous solution in a solvent with a low boiling point. The properties of a copper-clad laminate with the dielectric material of the invention were determined including Tg, heat decomposition temperature, heat decomposition time, solder heat resistance (288° C.), thermal expansion coefficient, water absorption, thermal conductivity, dielectric constant, dielectric loss tangent and flammability according to IPC-TM-650 test method manual. The determining results show the copper-clad laminate with the dielectric material of the invention has high Tg, excellent dielectric properties such as Dk and Df, low water absorption, high thermal resistance and high thermal conductivity. The copper-clad laminate is suitable used as a substrate for electronic elements and IC package.

EXAMPLES

TABLE 1

INFLUENCE OF PPE RESIN AMOUNT
EXAMPLE 4-1

| | | AMOUNT OF PPE RESIN | | | | | | |
|---|---|---|---|---|---|---|---|---|
| | | C1 | C2 | C3 | C4 | C5 | C6 | C7 |
| PPE resin | SA9000 | 60 | 52.5 | 45 | 41 | 37.5 | 34 | 22.5 |
| BMI resin | 5100 | 15 | 15 | 15 | 15 | 15 | 15 | 15 |
| Polybutadiene | Ricon100 | 10 | 10 | 10 | 10 | 10 | 10 | 10 |
| Crosslinking agents | TAIC | 15 | 22.5 | 30 | 34 | 37.5 | 41 | 52.5 |
| Flame retardants | XP7866, phr | 20 | 20 | 20 | 20 | 20 | 20 | 20 |
| fillers | Fused silica, phr | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 |
| Tg, TMA | IPC-TM-650 2.4.24.3 | 206 | 224 | 229 | 221 | 212 | 213 | 212 |
| coefficient of thermal expansion (α1/α2), ppm/° C. | IPC-TM-650 2.4.24 | 58/334 | 60/305 | 56/251 | 53/247 | 56/211 | 61/204 | 55/245 |

TABLE 1-continued

INFLUENCE OF PPE RESIN AMOUNT
EXAMPLE 4-1

| | | AMOUNT OF PPE RESIN | | | | | | |
|---|---|---|---|---|---|---|---|---|
| | | C1 | C2 | C3 | C4 | C5 | C6 | C7 |
| water absorption | PCT/121° C./1 hr | 0.29 | 0.33 | 0.34 | 0.34 | 0.39 | 0.39 | 0.40 |
| 288° C. thermal resistance | Dip288° C. | >600 | >600 | >600 | >600 | >600 | >600 | >600 |
| Dk(2-10 GHz) | Cavity | 3.93 | 3.89 | 3.89 | 3.89 | 3.90 | 3.86 | 3.87 |
| Df(2-10 GHz) | Cavity | 0.0057 | 0.0054 | 0.0048 | 0.0044 | 0.0040 | 0.0040 | 0.0039 |
| flammability | UL94 | V-0 | V-0 | V-0 | V-0 | V-0 | V-0 | V-0 |

Tg, Dk and Df were compared with different ratio and amount of PPE. The Tg level may be affected by the amount of PPE used. Also, the amount of PPE may also have an effect on the Dk and Df value. When the amount of PPE is high, Dk and Df may be high. When the amount of PPE is low, Dk and Df may be low. Typically, a low value for the Dk and Df is preferred. In addition, the thermal expansion coefficient may be raised when PPE is added, and BMI is added to balance the effect. In Table 1, part number SA9000 of PPE with chemical name of Polyphenylene Oxide (PPO) or Polyphenylene Ether (PPE) is produced by Sabic CO., LTD.

TABLE 2

INFLUENCE OF BMI RESIN SPECIES AND AMOUNT
EXAMPLE 4-2

| | | BMI RESIN | | | | | | | |
|---|---|---|---|---|---|---|---|---|---|
| | | A1 | A2 | A3 | A4 | A5 | A6 | A7 | A8 |
| PPE resin | SA9000 | 42.5 | 40 | 37.5 | 35 | 32.5 | 37.5 | 37.5 | 37.5 |
| BMI resin | 2300 | 0 | 0 | 0 | 0 | 0 | 0 | 15 | 0 |
| | 4000 | 0 | 0 | 0 | 0 | 0 | 15 | 0 | 0 |
| | 5100 | 5 | 10 | 15 | 20 | 25 | 0 | 0 | 0 |
| | TMH | 0 | 0 | 0 | 0 | 0 | 0 | 0 | 15 |
| Polybutadiene | Ricon100 | 10 | 10 | 10 | 10 | 10 | 10 | 10 | 10 |
| Crosslinking agents | TAIC | 42.5 | 40 | 37.5 | 35 | 32.5 | 37.5 | 37.5 | 37.5 |
| Flame retardants | XP7866, phr | 20 | 20 | 20 | 20 | 20 | 20 | 20 | 20 |
| fillers | Fused silica, phr | 20 | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 | 2.5 |
| Tg, TMA | IPC-TM-650 2.4.24.3 | 210 | 212 | 212 | 211 | 211 | 212 | 222 | 195 |
| Coefficient of thermal expansion (α1/α2), ppm/° C. | IPC-TM-650 2.4.24 | 60/296 | 58/250 | 56/211 | 54/207 | 50/197 | 55/260 | 45/170 | 45/288 |
| water absorption | PCT/121° C./1 hr | 0.30 | 0.34 | 0.39 | 0.44 | 0.46 | 0.41 | 0.47 | 0.33 |
| 288° C. thermal resistance | Dip288° C. | >600 | >600 | >600 | >600 | >600 | >600 | >600 | >600 |
| Dk(2-10 GHz) | Cavity | 3.85 | 3.87 | 3.90 | 3.94 | 3.98 | 3.91 | 3.93 | 3.86 |
| Df(2-10 GHz) | Cavity | 0.0040 | 0.0041 | 0.0040 | 0.0042 | 0.0043 | 0.0042 | 0.0046 | 0.0041 |
| flammability | UL94 | V-0 | V-0 | V-0 | V-0 | V-0 | V-1 | V-0 | V-0 |

| | | BMI RESIN | | | | | | | Comparative example |
|---|---|---|---|---|---|---|---|---|---|
| | | A9 | A10 | A11 | A12 | A13 | A14 | A15 | |
| PPE resin | SA9000 | 37 | 37 | 37 | 37 | 37 | 37.5 | 37 | 50 |
| BMI resin | 2300 | 8 | 0 | 8 | 0 | 0 | 5 | 4 | 0 |
| | 4000 | 8 | 8 | 0 | 8 | 0 | 5 | 4 | 0 |
| | 5100 | 0 | 8 | 0 | 0 | 8 | 5 | 4 | 0 |
| | TMH | 0 | 0 | 8 | 8 | 8 | 0 | 4 | 0 |

TABLE 2-continued

INFLUENCE OF BMI RESIN SPECIES AND AMOUNT
EXAMPLE 4-2

| | | | | | | | | | |
|---|---|---|---|---|---|---|---|---|---|
| Polybutadiene | Ricon100 | 10 | 10 | 10 | 10 | 10 | 10 | 10 | 0 |
| Crosslinking agents | TAIC | 37 | 37 | 37 | 37 | 37 | 37.5 | 37 | 50 |
| Flame retardants | XP7866, phr | 20 | 20 | 20 | 20 | 20 | 20 | 20 | 20 |
| fillers | Fused silica, phr | 20 | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 | 2.5 |
| Tg, TMA | IPC-TM-650 2.4.24.3 | 208 | 204 | 205 | 200 | 214 | 210 | 207 | 218 |
| Coefficient of thermal expansion (α1/α2), ppm/° C. | IPC-TM-650 2.4.24 | 50/210 | 57/278 | 45/230 | 52/268 | 54/290 | 53/240 | 49/225 | 64/325 |
| water absorption | PCT/121° C./ 1 hr | 0.43 | 0.42 | 0.41 | 0.36 | 0.44 | 0.40 | 0.39 | 0.33 |
| 288° C. thermal resistance | Dip288° C. | >600 | >600 | >600 | >600 | >600 | >600 | >600 | >600 |
| Dk(2-10 GHz) | Cavity | 3.96 | 3.91 | 3.90 | 3.87 | 3.89 | 3.91 | 3.90 | 3.80 |
| Df(2-10 GHz) | Cavity | 0.0041 | 0.0041 | 0.0045 | 0.004 | 0.0039 | 0.0041 | 0.0043 | 0.0044 |
| flammability | UL94 | V-0 | V-0 | V-0 | V-0 | V-0 | V-0 | V-0 | V-0 |

The coefficient of thermal expansion was measured with different species and amount of BMI resin. The more the amount of BMI resin is, the lower the coefficient of thermal expansion is. In the example, there are three kinds of comparison comprising three groups that A1-A5 shows different amount of BMI with the same species, A6-A8 shows the same amount of BMI with different species and A9-A15 shows about the same total amount of BMI with more than two species. In Table 2, part numbers 2300, 4000, 5100 and TMH of BMI are produced by Daiwakasei Industry CO., LTD, in which part number 2300 has chemical name of phenyl methane maleimide, part number 4000 has chemical name of 2,2'-bis[4-(4-maleimidophenoxy)phenyl]propane, part number 5100 has chemical name of 3,3'-dimethyl-5,5'-diethyl-4,4'-diphenylmethane bismaleimide and part number TMH has chemical name of 1,6'-bismaleimide-(2,2,4-trimethyl)hexane.

It can be found from group A1-A5 that by increasing the amount of BMI resin, the thermal expansion coefficient would decrease. However, by increasing the amount of BMI resin, the water absorption would also increase. As to group A6-A8, different BMI resins may reduce the thermal expansion coefficient, but would also affect the water absorption. Regarding group A9-A15, different combination of BMI resins may reduce the thermal expansion coefficient, and affect the water absorption also. In the invention, the object of addition of BMI to the dielectric material is to reduce the thermal expansion coefficient. However, the more the amount of BMI resin is, the higher the water absorption is. Therefore, the polymer additives are added to reduce the water absorption.

TABLE 3

INFLUENCE OF POLYMER ADDITIVES SPECIES AND AMOUNT
EXAMPLE 4-3

| | | POLYMER ADDITIVES | | | | | | |
|---|---|---|---|---|---|---|---|---|
| | | B1 | B2 | B3 | B4 | B5 | B6 | B7 |
| PPE resin | SA9000 | 40 | 37.5 | 35 | 32.5 | 30 | 37.5 | 37.5 |
| BMI resin | 5100 | 15 | 15 | 15 | 15 | 15 | 15 | 15 |
| Polybutadiene | Ricon100 | 5 | 10 | 15 | 20 | 25 | 0 | 0 |
| | Ricon130MA8 | 0 | 0 | 0 | 0 | 0 | 10 | 0 |
| | Ricon150 | 0 | 0 | 0 | 0 | 0 | 0 | 10 |
| | Ricon257 | 0 | 0 | 0 | 0 | 0 | 0 | 0 |
| SMA | S:M = 3:1 | 0 | 0 | 0 | 0 | 0 | 0 | 0 |
| | S:M = 4:1 | 0 | 0 | 0 | 0 | 0 | 0 | 0 |
| | S:M = 5:1 | 0 | 0 | 0 | 0 | 0 | 0 | 0 |
| | S:M = 6:1 | 0 | 0 | 0 | 0 | 0 | 0 | 0 |
| | S:M = 8:1 | 0 | 0 | 0 | 0 | 0 | 0 | 0 |
| Crosslinking agents | TAIC | 40 | 37.5 | 35 | 32.5 | 30 | 37.5 | 37.5 |

TABLE 3-continued

INFLUENCE OF POLYMER ADDITIVES SPECIES AND AMOUNT
EXAMPLE 4-3

| | | | | | | | | |
|---|---|---|---|---|---|---|---|---|
| Flame retardant | XP7866, phr | 20 | 20 | 20 | 20 | 20 | 20 | 20 |
| Fillers | Fused silica, phr | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 |
| Tg, TMA | IPC-TM-650 2.4.24.3 | 221 | 212 | 200 | 194 | 186 | 213 | 217 |
| coefficient of thermal expansion ($\alpha1/\alpha2$), ppm/° C. | IPC-TM-650 2.4.24 | 53/201 | 56/211 | 64/220 | 67/260 | 74/300 | 58/265 | 57/270 |
| water absorption | PCT/121° C./1 hr | 0.43 | 0.39 | 0.35 | 0.32 | 0.28 | 0.45 | 0.43 |
| 288° C. thermal resistance | Dip288° C. | >600 | >600 | >600 | >600 | >600 | >600 | >600 |
| Dk(2-10 GHz) | Cavity | 3.93 | 3.90 | 3.87 | 3.86 | 3.84 | 3.92 | 3.90 |
| Df(2-10 GHz) | Cavity | 0.0043 | 0.0040 | 0.0041 | 0.0040 | 0.0039 | 0.0045 | 0.0044 |
| flammability | UL94 | V-0 | V-0 | V-0 | V-1 | V-1 | V-0 | V-0 |

| | | POLYMER ADDITIVES | | | | | |
|---|---|---|---|---|---|---|---|
| | | B9 | B10 | B11 | B12 | B13 | Comparative example |
| PPE resin | SA9000 | 37.5 | 37.5 | 37.5 | 37.5 | 37.5 | 42.5 |
| BMI resin | 5100 | 15 | 15 | 15 | 15 | 15 | 15 |
| Polybutadiene | Ricon100 | 0 | 0 | 0 | 0 | 0 | 0 |
| | Ricon130MA8 | 0 | 0 | 0 | 0 | 0 | 0 |
| | Ricon150 | 0 | 0 | 0 | 0 | 0 | 0 |
| | Ricon257 | 0 | 0 | 0 | 0 | 0 | 0 |
| SMA | S:M = 3:1 | 10 | 0 | 0 | 0 | 0 | 0 |
| | S:M = 4:1 | 0 | 10 | 0 | 0 | 0 | 0 |
| | S:M = 5:1 | 0 | 0 | 10 | 0 | 0 | 0 |
| | S:M = 6:1 | 0 | 0 | 0 | 10 | 0 | 0 |
| | S:M = 8:1 | 0 | 0 | 0 | 0 | 10 | 0 |
| Crosslinking agents | TAIC | 37.5 | 37.5 | 37.5 | 37.5 | 37.5 | 42.5 |
| Flame retardants | XP7866, phr | 20 | 20 | 20 | 20 | 20 | 20 |
| fillers | Fused silica, phr | 20 | 20 | 20 | 20 | 20 | 20 |
| catalysts | Peroxide 119° C. for a half life of 10 hrs | 2.5 | 2.5 | 2.5 | 2.5 | 2.5 | 2.5 |
| Tg, TMA | IPC-TM-650 2.4.24.3 | 220 | 215 | 210 | 206 | 195 | 222 |
| coefficient of thermal expansion ($\alpha1/\alpha2$), ppm/° C. | IPC-TM-650 2.4.24 | 45/232 | 48/237 | 50/245 | 51/240 | 53/260 | 45/200 |
| water absorption | PCT/121° C./1 hr | 0.46 | 0.45 | 0.43 | 0.43 | 0.40 | 0.56 |
| 288° C. thermal resistance | Dip288° C. | >600 | >600 | >600 | >600 | >600 | >600 |
| Dk(2-10 GHz) | Cavity | 3.95 | 3.95 | 3.93 | 3.91 | 3.90 | 3.93 |
| Df(2-10 GHz) | Cavity | 0.0085 | 0.0073 | 0.0064 | 0.0056 | 0.0042 | 0.0043 |
| flammability | UL94 | V-0 | V-0 | V-0 | V-0 | V-0 | V-0 |

The water absorption was measured with different species and amount of polymer additives. Polybutadiene (PB) and styrene-maleic anhydride (SMA) were used as the polymer additives in the invention. It can be found from using the different amount of PB with the same species that by increasing the amount of PB, the water absorption would decrease. However, with the increasing amount of PB, the coefficient of thermal expansion would also increase. As to using different species of PB in combination with SMA, it shows SMA can reduce the water absorption and the coefficient of thermal expansion, but Df may remain high. However, PB can be used to reduce Df. In Table 3, part numbers Ricon100, Ricon130MA8, Ricon150 and Ricon257 of PB are produced by Sartomer CO., LTD, in which part number Ricon 100 has chemical name of butadiene styrene copolymer, part number Ricon130MA8 has chemical name of butadiene adducted with maleic anhydride, part number Ricon 150 has chemical name of polybutadiene resin and Ricon 257 has chemical name of polybutadiene grafted with styrene and benzene in toluene solution. In Table 3, SMA with S:M=3:1 indicates that the ratio of styrene to maleic anhydride is 3 to 1. Generally, the ratios are about 1:1~12:1.

TABLE 4

INFLUENCE OF DIFFERENT SPECIES OF CROSSLINKING AGENTS

| | | | CROSSLINKING AGENT | |
|---|---|---|---|---|
| EXAMPLE 4-4 | | D1 | D2 | D3 |
| PPE resin | SA9000 | 37.5 | 37.5 | 37.5 |
| BMI resin | 5100 | 15 | 15 | 15 |
| polybutadiene | Ricon100 | 10 | 10 | 10 |
| Crosslinking agents | TAC | 37.5 | 0 | 0 |
| | TAIC | 0 | 37.5 | 0 |
| | TBS | 0 | 0 | 37.5 |

TABLE 4-continued

INFLUENCE OF DIFFERENT SPECIES OF CROSSLINKING AGENTS

| | EXAMPLE 4-4 | CROSSLINKING AGENT | | |
|---|---|---|---|---|
| | | D1 | D2 | D3 |
| Flame retardants | XP7866, phr | 20 | 20 | 20 |
| fillers | Fused silica, phr | 20 | 20 | 20 |
| catalysts | Peroxide 119° C. for a half life of 10 hrs | 2.5 | 2.5 | 2.5 |
| Tg, TMA | IPC-TM-650 2.4.24.3 | 183 | 212 | 202 |
| coefficient of thermal expansion (α1/α2), ppm/° C. | IPC-TM-650 2.4.24 | 59/273 | 56/211 | 50/250 |
| water absorption | PCT/121° C./1 hr | 0.39 | 0.39 | 0.12 |
| 288° C. thermal resistance | Dip288° C. | >600 | >600 | >600 |
| Dk(2-10 GHz) | Cavity | 3.95 | 3.90 | 3.75 |
| Df(2-10 GHz) | Cavity | 0.0039 | 6.0040 | 0.0035 |
| flammability | UL94 | V-0 | V-0 | V-0 |

The dielectric material of the invention may comprise at least one crosslinking agent with 40-80 parts by weight selected from the following groups consisting of Triallyl cyanurate (TAC), Triallyl isocyanurate (TAIC) and 4-tert-butylstyrene. The properties of a copper-clad laminate with the dielectric material of the invention were measured with different species of crosslinking agents. It can be found by using TAC that Tg and the coefficient of thermal expansion were poor, and water absorption, Dk and Df were of ordinary level. As to TAIC, all the properties of a copper-clad laminate with the dielectric material of the invention were of ordinary level. Regarding 4-tert-butylstyrene, the coefficient of thermal expansion, water absorption and Df were excellent, but Dk is low,

TABLE 5

INFLUENCE OF DIFFERENT SPECIES OF FLAME RETARDANTS

| | EXAMPLE 4-5 | FLAME RETARDANTS | | | |
|---|---|---|---|---|---|
| | | E1 | E2 | E3 | E4 |
| PPE resin | SA9000 | 37.5 | 37.5 | 37.5 | 37.5 |
| BMI resin | 5100 | 15 | 15 | 15 | 15 |
| polybutadiene | Ricon100 | 10 | 10 | 10 | 10 |
| Crosslinking agents | TAIC | 37.5 | 37.5 | 37.5 | 37.5 |
| Flame retardants | Decabromodiphenyl Ethane, pbr | 10 | 0 | 0 | 0 |
| | XP7866, phr | 0 | 20 | 15 | 10 |
| | Tetrakis(2,6-dimethylphenyl) 1,3-phenylene bisphosphate, phr | 0 | 0 | 5 | 10 |
| fillers | Fused silica, phr | 20 | 20 | 20 | 20 |
| catalysts | Peroxide 119° C. for a half life of 10 hrs | 2.5 | 2.5 | 2.5 | 2.5 |
| Tg, TMA | IPC-TM-650 2.4.24.3 | 224 | 212 | 226 | 180 |
| coefficient of thermal expansion (α1/α2), ppm/° C. | IPC-TM-650 2.4.24 | 55/233 | 56/211 | 65/267 | 67/339 |
| water absorption | PCT/121° C./1 hr | 0.43 | 0.39 | 0.37 | 0.30 |
| 288° C. thermal resistance | Dip288° C. | >60 | >600 | >600 | >600 |
| Dk(2-10 GHz) | Cavity | 3.83 | 3.90 | 3.87 | 3.85 |
| Df(2-10 GHz) | Cavity | 0.0043 | 0.0040 | 0.0040 | 0.0037 |
| flammability | UL94 | V-0 | V-0 | V-0 | V-0 |

If desired, the dielectric material of the invention may optionally comprise flame retardants. A halogen-containing flame retardant of decabromodiphenyl ethane with 7-15 phr based on the total weight of PPE, BMI, polymer additives and crosslinking agents may be added to the dielectric material of the invention. The dielectric material of the invention may comprise at least one flame retardant without halogen with 12-14 phr based on the total weight of PPE, BMI, polymer additives and crosslinking agents selected from the following groups consisting of phosphor-containing flame retardants and phosphates. The phosphor-containing flame retardants and phosphates are produced by ALBEMARLE CO., LTD. The phosphates are like tetrakis(2,6-dimethylphenyl) 1,3-phenylene bisphosphate.

TABLE 6

INFLUENCE OF DIFFERENT SPECIES OF FILLERS
EXAMPLES 4-6

| | | FILLERS | | | | | | |
|---|---|---|---|---|---|---|---|---|
| | | F1 | F2 | F3 | F4 | F5 | F6 | F7 |
| PPE resin | SA9000 | 37.5 | 37.5 | 37.5 | 37.5 | 37.5 | 37.5 | 37.5 |
| BMI resin | 5100 | 15 | 15 | 15 | 15 | 15 | 15 | 15 |
| polybutadiene | Ricon100 | 10 | 10 | 10 | 10 | 10 | 10 | 10 |
| Crosslinking agents | TAIC | 37.5 | 37.5 | 37.5 | 37.5 | 37.5 | 37.5 | 37.5 |
| Flame retardants | XP7866, phr | 20 | 20 | 20 | 20 | 20 | 20 | 20 |
| fillers | Fused silica, phr | 0 | 20 | 10 | 10 | 30 | 25 | 45 |
| | Ball type silica | 20 | 0 | 10 | 0 | 0 | 0 | 0 |
| catalysts | Peroxide 119° C. for a half life of 10 hrs | 2.5 | 2.5 | 2.5 | 2.5 | 2.5 | 2.5 | 2.5 |
| Tg, TMA | IPC-TM-650 2.4.24.3 | 210 | 212 | 214 | 220 | 208 | 215 | 195 |
| coefficient of thermal expansion ($\alpha 1/\alpha 2$), ppm/° C. | IPC-TM-650 2.4.24 | 53/220 | 56/211 | 52/225 | 58/260 | 45/210 | 50/220 | 40/205 |
| water absorption | PCT/121° C./1 hr | 0.41 | 0.39 | 0.40 | 0.39 | 0.38 | 0.40 | 0.36 |
| 288° C. thermal resistance | Dip288° C. | >600 | >600 | >600 | >600 | >600 | >600 | >600 |
| Dk(2-10 GHz) | Cavity | 3.87 | 3.90 | 3.88 | 3.85 | 3.96 | 4.01 | 4.06 |
| Df(2-10 GHz) | Cavity | 0.0039 | 0.0040 | 0.0040 | 0.0040 | 0.0041 | 0.0043 | 0.0045 |
| flammability | UL94 | V-0 | V-0 | V-0 | V-0 | V-0 | V-0 | V-0 |

The dielectric material of the invention may optionally comprise fillers. The suitable fillers such as fused silica and sphere-shaped silica may be used. The suitable amount of filler is 8-50 phr based on the total weight of PPE, BMI, polymer additives and crosslinking agents. It can be found from the fused silica and the sphere-shaped silica with the same amount that the sphere-shaped silica has lower Dk and Df than the fused silica.

TABLE 7

INFLUENCE OF DIFFERENT AMOUNT AND SPECIES OF CATALYSTS
EXAMPLE 4-7

| | | CATALYSTS | | | |
|---|---|---|---|---|---|
| | | G1 | G2 | G3 | G4 |
| PPE resin | SA9000 | 37.5 | 37.5 | 37.5 | 37.5 |
| BMI resin | 5100 | 15 | 15 | 15 | 15 |
| polybutadiene | Ricon100 | 10 | 10 | 10 | 10 |
| Crosslinking agents | TAIC | 37.5 | 37.5 | 37.5 | 37.5 |
| Flame retardants | XP7866, phr | 20 | 20 | 20 | 20 |
| fillers | Ball type silica | 20 | 20 | 20 | 20 |
| catalysts | Peroxide 116° C. for a half life of 10 hrs | 0 | 0 | 0 | 0 |
| | Peroxide 119° C. for a half life of 10 hrs | 2.5 | 3 | 7 | 8 |

TABLE 7-continued

INFLUENCE OF DIFFERENT AMOUNT AND SPECIES OF CATALYSTS
EXAMPLE 4-7

|  |  |  |  |  |  |
|---|---|---|---|---|---|
|  | Peroxide 128° C. for a half life of 10 hrs | 0 | 0 | 0 | 0 |
| Tg, TMA | IPC-TM-650 2.4.24.3 | 212 | 220 | 222 | 227 |
| coefficient of thermal expansion (α1/α2), ppm/° C. | IPC-TM-650 2.4.24 | 56/211 | 53/225 | 49/220 | 50/180 |
| water absorption | PCT/121° C./1 hr | 0.39 | 0.43 | 0.47 | 0.60 |
| 288° C. thermal resistance | Dip288° C. | >600 | >600 | >600 | >600 |
| Dk(2-10 GHz) | Cavity | 3.90 | 3.91 | 3.90 | 3.96 |
| Df(2-10 GHz) | Cavity | 0.0040 | 0.0042 | 0.0045 | 0.0049 |
| flammability | UL94 | V-0 | V-0 | V-0 | V-0 |

|  |  | CATALYSTS | | | | |
|---|---|---|---|---|---|---|
|  |  | G5 | G6 | G7 | G8 | G9 |
| PPE resin | SA9000 | 37.5 | 37.5 | 37.5 | 37.5 | 37.5 |
| BMI resin | 5100 | 15 | 15 | 15 | 15 | 15 |
| polybutadiene | Ricon100 | 10 | 10 | 10 | 10 | 10 |
| Crosslinking agents | TAIC | 37.5 | 37.5 | 37.5 | 37.5 | 37.5 |
| Flame retardants | XP7866, phr | 20 | 13 | 13 | 13 | 13 |
| fillers | Ball type silica | 20 | 13 | 13 | 13 | 13 |
| catalysts | Peroxide 116° C. for a half life of 10 hrs | 2.5 | 0 | 1.5 | 1.5 | 1 |
|  | Peroxide 119° C. for a half life of 10 hrs | 0 | 0 | 0 | 1.5 | 1 |
|  | Peroxide 128° C. for a half life of 10 hrs | 0 | 2.5 | 1.5 | 0 | 1 |
| Tg, TMA | IPC-TM-650 2.4.24.3 | 208 | 225 | 220 | 209 | 215 |
| coefficient of thermal expansion (α1/α2), ppm/° C. | IPC-TM-650 2.4.24 | 57/230 | 50/230 | 47/226 | 52/220 | 50/235 |
| water absorption | PCT/121° C./1 hr | 0.42 | 0.38 | 0.40 | 0.42 | 0.38 |
| 288° C. thermal resistance | Dip288° C. | >600 | >600 | >600 | >600 | >600 |
| Dk(2-10 GHz) | Cavity | 3.88 | 3.91 | 3.92 | 3.93 | 3.91 |
| Df(2-10 GHz) | Cavity | 0.0039 | 0.0040 | 0.0041 | 0.0042 | 0.0039 |
| flammability | UL94 | V-0 | V-0 | V-0 | V-0 | V-0 |

The dielectric material of the invention may optionally comprise catalysts including peroxides having 116° C.-128° C. for a half life of 10 hours. The suitable amount of peroxide is 2-8 phr based on the total weight of PPE, BMI, polymer additives and crosslinking agents. The preferable catalyst is a peroxide having 119° C. for a half life of 10 hours.

The dielectric material of the invention may comprise PPE, but not comprise epoxy resin. The desired values of Dk and/or Df cannot be obtained, if epoxy resin is added to the dielectric material of the invention. When reacting epoxy resin with the dielectric material of the invention, the open rings of the epoxy resin may produce excess OH groups, therefore causing the Dk and Df value to remain high and unable to decrease.

What is claimed is:

1. A dielectric resin composition with low dielectric loss comprising:
   (i) 40-80 parts by weight of polyphenylene ether (PPE) resin having a Mw of 1000-7000, a Mn of 1000-4000 and Mw/Mn=1.0-1.8;
   (ii) 5-30 parts by weight of bismaleimide resins; and
   (iii) 5-30 parts by weight of polymer additives, wherein the dielectric resin composition has Dk of 3.75-4.0 and Df of 0.0025-0.0045,
   wherein polyphenylene ether resin is represented by the formula

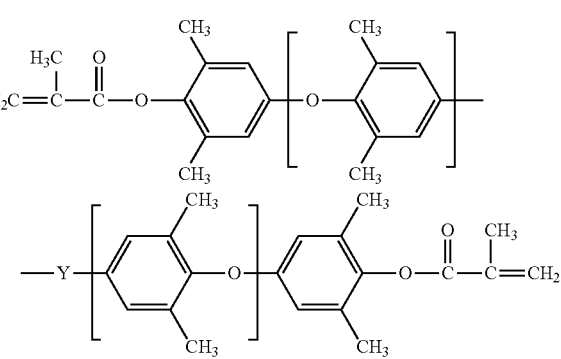

wherein Y represents at least one C, O and benzene ring or the combination.

2. The dielectric resin composition with low dielectric loss of claim 1, wherein bismaleimide resins are selected from groups consisting of
phenylmethane maleimide

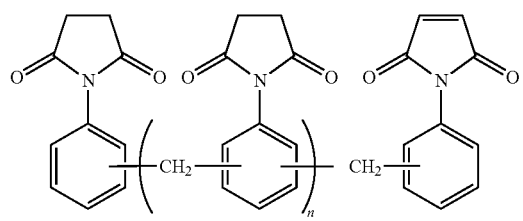

wherein n≥1;
bisphenol A diphenyl ether bismaleimide

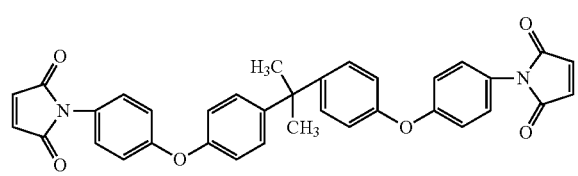

3,3'-dimethyl-5,5'-diethyl-4,4'-diphenylethane bismaleimide

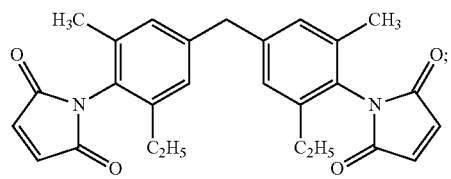 [SMILES: CCc1cc(Cc2cc(C)c(N3C(=O)C=CC3=O)c(CC)c2)cc(C)c1N1C(=O)C=CC1=O]

and 1,6-bismaleimide-(2,2,4-trimethyl)hexane

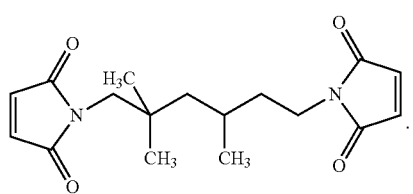 [SMILES: CC(CCN1C(=O)C=CC1=O)CC(C)(C)CN1C(=O)C=CC1=O]

3. The dielectric resin composition with low dielectric loss of claim 1, wherein the polymer additives are selected from groups consisting of:
homopolymers of butadiene

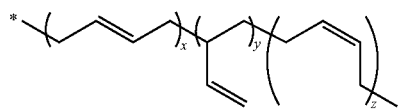

wherein y=70% and x+z=30%;
random copolymers of butadiene and styrene

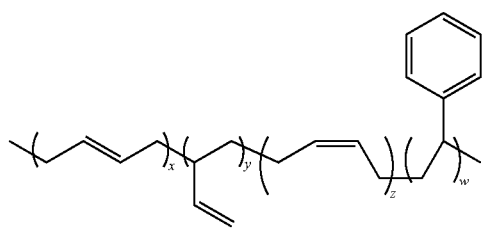

wherein y=30%, x+z=70% and w=≥1, the amount of styrene=25 wt %;
maleinized polybutadiene

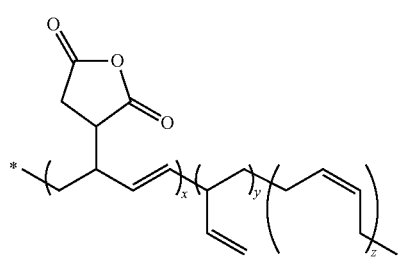

wherein y=28% and x+z=72%, the amount of maleic anhydride=8 wt %;
butadiene-styrene-divinylbenzene copolymer; and
styrene maleic anhydride copolymer

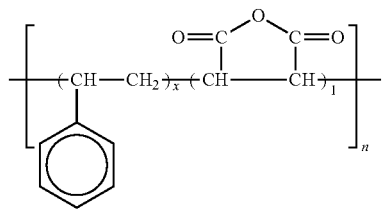

wherein X=1~8 and n≥1.

* * * * *